United States Patent [19]

Inohara et al.

[11] 4,347,074
[45] Aug. 31, 1982

[54] SEALING TECHNIQUE FOR SEMICONDUCTOR DEVICES

[75] Inventors: Akio Inohara, Osaka; Kiyoshi Sawae, Nara; Hisao Kawaguchi, Sakai; Takeo Fujimoto, Osaka, all of Japan

[73] Assignee: Sharp Kabushiki Kaisha, Osaka, Japan

[21] Appl. No.: 207,470

[22] Filed: Nov. 17, 1980

[30] Foreign Application Priority Data

Nov. 16, 1979 [JP] Japan .................................. 54-149294
Feb. 14, 1980 [JP] Japan .................................. 55-17446
Feb. 14, 1980 [JP] Japan .................................. 55-17447

[51] Int. Cl.$^3$ ............................................. C03C 27/04
[52] U.S. Cl. ............................................ 65/32; 65/43; 65/59.5
[58] Field of Search ........................... 65/32, 43, 59.5

[56] References Cited

U.S. PATENT DOCUMENTS

| | | | |
|---|---|---|---|
| 2,515,706 | 7/1950 | Greiner et al. | 65/43 |
| 3,123,470 | 3/1964 | Denison, Jr. | 65/43 |
| 4,049,416 | 9/1977 | Bloem | 65/32 |
| 4,184,189 | 1/1980 | Davis et al. | 65/43 X |

Primary Examiner—Richard V. Fisher
Attorney, Agent, or Firm—Birch, Stewart, Kolasch & Birch

[57] ABSTRACT

A sealing technique is disclosed by which the firing voltage of atmospheric discharge is increased by a pressurizing procedure such that the internal pressure of a sealing chamber is held at room temperature above half (0.5) of the atmospheric pressure even after the completion of sealing. Preferably, the pressurizing procedure is accomplished by a partial modification in the existing sealing facilities (for example, belt furnaces and low temperature furnaces). In another aspect of the invention, the method for sealing a semiconductor device minimizes water in the chamber after sealing by suppressing water expelled from glass frit during sealing or allowing the glass frit to absorb the water expelled therefrom. In other words, sealing is performed first under nitrogen gas atmosphere and then under oxygen gas atmosphere.

4 Claims, 5 Drawing Figures

SEALING TECHNIQUE FOR SEMICONDUCTOR DEVICES

BACKGROUND OF THE INVENTION

This invention relates to a method for sealing semiconductor devices and more particularly to a a glass frit sealing technique suitable for the manufacture of highly reliable semiconductor devices.

The sealing of semiconductors is generally classified into (1) resin sealing, (2) metal welding and (3) glass frit sealing. The first method (1) is most desirable for mass production but hardly applicable to the manufacture of semiconductor devices whose interface may be adversely affected by moisture (for example, ones with an offset structure) and semiconductor devices which demand a high degree of reliability, because of moisture permeability of the resin itself. The last two methods (2) and (3) are able to provide a complete hermetic seal and are applicable to the manufacture of the semiconductor devices which are susceptible to moisture and require high reliability although being rather expensive.

Of those said last two methods, the method (3) is more inexpensive and favorable for mass production. However, the last method (3) has the problem of low breakdown voltage as follows: While sealing can be performed with an internal cavity pressure of the order of the atmospheric pressure in the method (2), sealing according to the method (3) is carried out under the condition that the whole of a semiconductor device is held at an elevated temperature of more than 350° C. In the latter method, the internal pressure of a cavity decreases to about 0.4 to 0.5 atmospheric pressure at room temperature after the sealing procedure with the possibility that atmospheric discharge will take place between the bonding wires and the semiconductor device, for example.

Pursuant to Paschen's law, there is a linear relationship between firing voltage $V_s$ (V) and the product of pressure $P_o$ (mm Hg) and the discharge distance d (cm) as indicated in FIG. 1. It is universally known that the firing voltage decreases with pressure except for vacuum sealing procedures. Especially for the semiconductor devices which require high breakdown voltages, this promotes a decrease in yield due to inferior initial pressure resistance and restricts integration density and layout flexibility.

For these reasons, in order to manufacture semiconductor devices with high breakdown voltage, high reliability and high circuit density requirements on an economical basis, it is necessary to increase the firing voltage of atmospheric discharge in the glass frit sealing method. Potential approaches to meet such requirements are as follows:

(1) protection of a metal portion with an electrical insulating coating; and
(2) vaccum sealing.

In connection with the first approach (1), an inorganic insulating coating is desirable since it is to be exposed to a considerably high temperature above 350° C. during sealing. The use of a passivation coating such as $SiO_2$, $Si_3N_4$ and PSG results in defects including unavoidable pinholes occurring during manufacture and cracks caused by the difference in coefficient of thermal expansion between the passivation coating and metals and is insufficient to avoid atmospheric discharge. It is not practical to overlay the surfaces of wires (terminals) and bonding pads with such an insulating coating.

The second approach (2) also has difficulty in establishing a high vacuum seal due to discharge gas from the glass frit during sealing and inferiority in mass productivity and manufacturing cost. Furthermore, in the event that the hermetic seal is broken during use due to fluctuating temperature and oscillation, there is an increased possibility of causing atmospheric discharge.

Another serious problem with the glass frit sealing method (3) is that water may be expelled from the glass frit in its molten state. It is in principle impossible to perform sealing under the condition that the interior of a cavity is deprived completely of water.

OBJECTS AND SUMMARY OF THE INVENTION

Accordingly, it is an object of the present invention to provide a new sealing technique which overcomes the above discussed disadvantages with the prior art.

Another object of the present invention is to provide a new glass frit sealing technique by which the firing voltage of atmospheric discharge is increased by a pressurizing procedure such that the internal pressure of a cavity or a sealing chamber is held at room temperature above half (0.5) of the atmospheric pressure even after the completion of sealing. Preferably, the pressurizing procedure of the present invention is accomplished by a partial modification in the existing sealing facilities (for example, belt furnaces and low temperature furnaces).

Still another object of the present invention is to provide a new and useful technique for sealing semiconductor devices which minimizes water in a cavity after sealing by suppressing water expelled from the glass frit during sealing or allowing the glass frit to absorb the water expelled therefrom.

BRIEF DESCRIPTION OF THE DRAWINGS

For a more complete understanding of the present invention and for further objects and advantages thereof, reference is now made to the following description taken in conjunction with the accompanying drawings, in which.

DETAILED DESCRIPTION OF THE INVENTION

As stated previously, one significant feature of the present invention resides in that sealing is performed with a glass frit under the condition that the surrounding atmosphere is pressurized in advance of sealing such that the internal cavity pressure is held above 0.5 atmospheric pressure (more preferably, 0.6 to 0.8 atmospheric pressure) at room temperature even after the completion of sealing.

Figure 1:
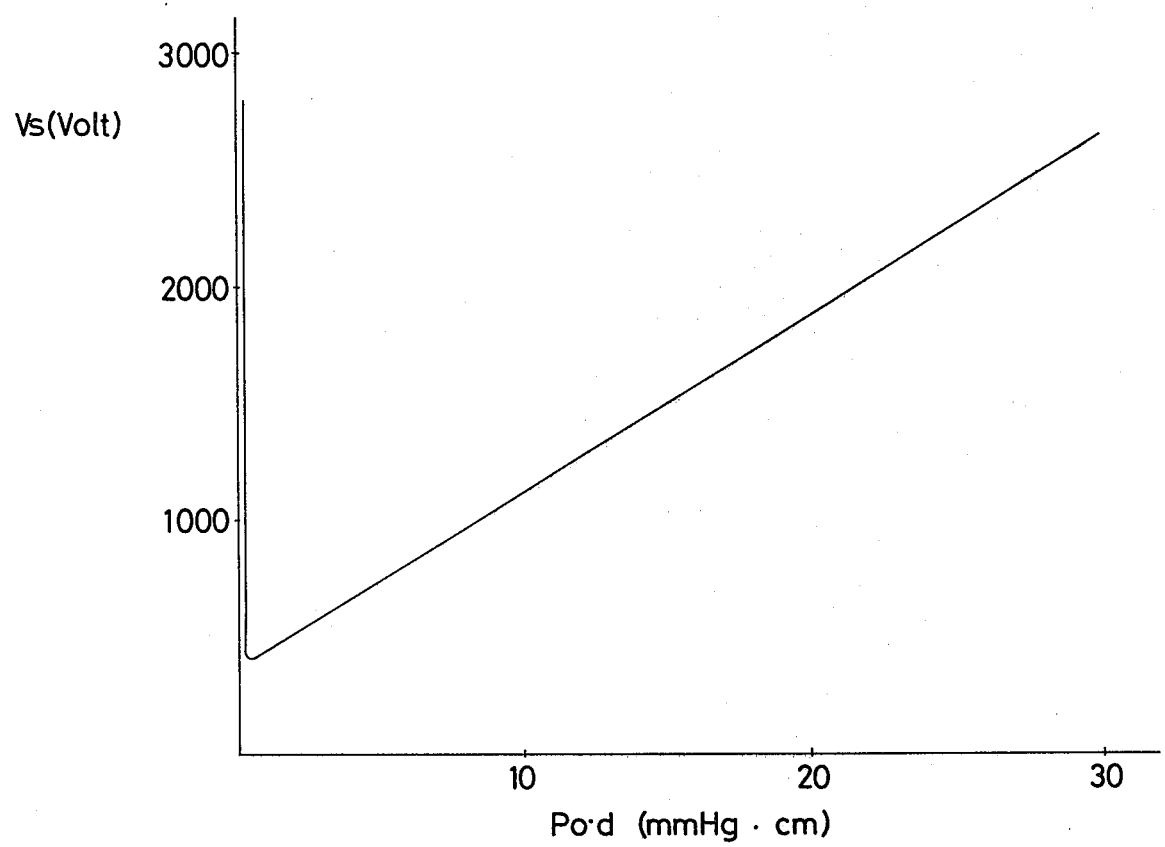
FIG. 1 is a graph showing firing voltage as a function of the product of pressure and discharge distance.

For example, measurements of the firing voltage of atmospheric discharge were carried out on high breakdown voltage MOS-ICs which had been sealed with glass frit through a mere heating process and those which have been sealed after the pressurizing procedure as taught by the present invention. The semiconductor devices used were covered with an insulating coating as a protective device except for the bonding pads. Whereas discharge took place at many places especially in the vicinity of pinholes and cracks in the protective coating overlaying the source and drain areas relatively close to the bonding wires which were subjected to high voltage in the devices sealed under a non-pressurized atmosphere, the specimen devices sealed under the pressurized atmosphere showed an increase in firing voltage and a decrease in the possibility of atmospheric discharge occurring within a permissible range of breakdown voltage of the devices. The gradient of increasing firing voltage is clearly understood from FIG. 1 (say, 100–150 volts with an increase of 0.3 atmospheric pressure). That is, the present invention provides a remarkable improvement in anti-atmospheric discharge properties.

According to another significant feature of the present invention, sealing is performed with a glass frit under an atmosphere including nitrogen gas or another inert gas to thereby remove moisture expelled from the glass frit during sealing or to allow the glass frit to absorb the water with a minimum of water contained in the resulting glass frit.

Figure 2:
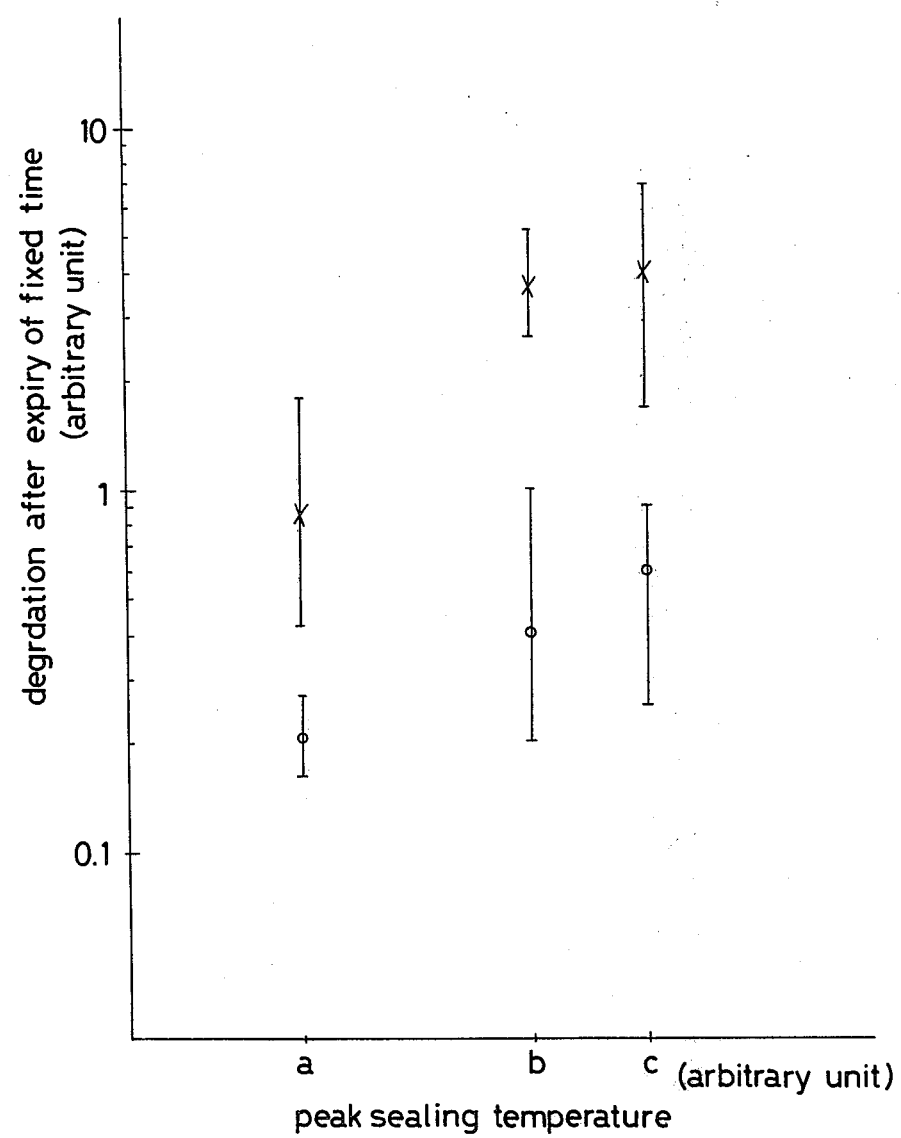
FIG. 2 is a graph showing results of downgrading tests.

To observe the effect of the present invention, MOS-ICs sealed under the nitrogen gas atmosphere were prepared by proper selection of several sorts of glass frit IC packages on the market as a sealant while peak temperature, retention time and other conditions were varied. FIG. 2 indicates the results of moisture-originating degradation tests on the MOS-IC samples which were susceptible to dew point and moisture. In FIG. 2, the mark "O" represents the IC devices sealed under a dry nitrogen gas atmosphere and the mark "X" the IC devices sealed under a dry air atmosphere.

The results of measurements of the dew point in the cavity indicate that the dew point was more than $-20°$ C. when sealing was performed under the dry air atmosphere and less than $-20°$ C. when the same was performed under the dry nitrogen gas atmosphere. Most of the samples were of extremely low moisture to such an extent that it was not possible to measure dew point. It was also found as a result of the moisture-originating degradation tests on the MOS-ICs that the IC samples sealed under the dry nitrogen gas atmosphere were relatively slow to degrade due to moisture and typically $\frac{1}{8}$ to 1/10 upon the passage of a given period of time as compared with those sealed under the dry air atmosphere. It is evident from the foregoing that the sealing procedure of the present invention suppresses the downgrading of semiconductor devices and thus provides highly reliable semiconductor devices through only adjustments of the surrounding gas.

Figures 3A, 3B:
FIGS. 3(a) and 3(b) are schematic views showing sealed states of semiconductor devices.

Provided that glass frit sealing is carried out under the nitrogen gas atmosphere in the above manner, package materials, which are typically ceramic, have poor affinity with glass as is best understood from the dotted line in FIG. 3(a). On the other hand, when sealing is performed in a dry air atmosphere containing oxygen, the package material demonstrates satisfactory affinity as indicated in FIG. 3(b). The devices with affinity as shown in FIG. 3(a) gave unsatisfactory results in He leakage and thus reliability through temperature cycle tests and thermal shock tests. An improvement in affinity is generally possible by elevating sealing temperature and elongating sealing time but in conflict with the requirement for simplicity of manufacturing steps.

According to the present invention, in order to give better results in thermal shock tests and temperature cycle tests without varying the sealing temperature and time, a preliminary seal of glass frit is first established under the atmosphere containing nitrogen gas or another inert gas and then, subsequent to the complete sealing of the cavity with nitrogen gas, the seal is completed under another atmosphere containing oxygen gas.

Figure 4:
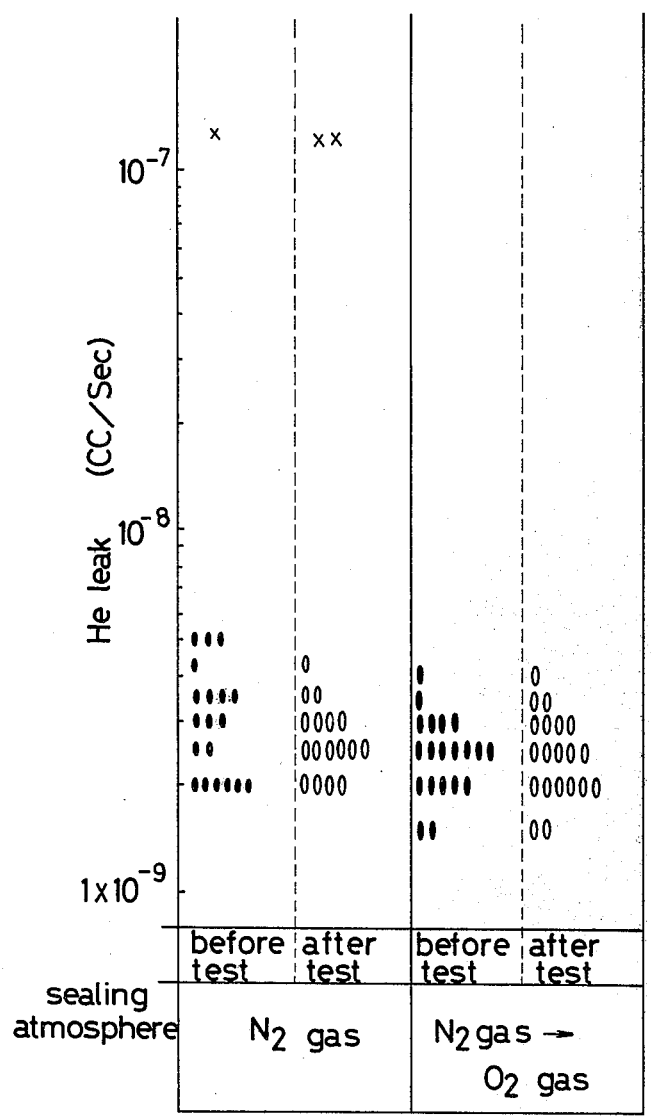
FIG. 4 shows the relationship between atmosphere gas and thermal shock tests for explanation of one aspect of the present invention.

Thermal shock tests were conducted on a variety of glass frit seals pursuant to the MIL standard with the glass frit seals being formed as a function of the surrounding atmosphere with the other sealing conditions unchanged. The results of those thermal shock tests are depicted in terms of He leakage in FIG. 4. Whereas of 20 samples sealed only under nitrogen gas atmosphere one showed He leakage before the tests and two showed He leakage after the tests, none of 20 samples sealed in nitrogen gas and then in oxygen gas showed any degradation. When the moisture in the cavity was measured with the aid of a moisture sensor, there was no appreciable difference between the former and latter.

If it is desired to seal an MOS-IC, it is preferable to temporarily seal the IC with glass frit under the nitrogen gas atmosphere and complete the sealing of the IC under the oxygen gas atmosphere. As noted earlier, the introduction of oxygen gas insures good affinity of glass frit and provides a tight and reliable seal.

The following constitute recommended conditions of sealing semiconductor devices:
pressure: 0.6–0.8 atmospheric pressure
nitrogen ($N_2$) flow rate: 4 l/min
oxygen ($O_2$) flow rate: 4 l/min
seal temperature: 400° C.
glass frit: low melting point glass frit
   Model NCG-56S by Narumi Seito
   temperature cycle: 1.8° C./sec increase—400° C.—1.3° C./sec decrease
nitrogen gas exposure: 10 min
oxygen gas exposure: 5 min
IC used: high voltage IC NZ-1033 by Sharp The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for sealing a semiconductor device, comprising the steps of:
   introducing a semiconductor device into a sealing chamber;
   applying a glass frit to said semiconductor device;
   pressurizing the atmosphere in said sealing chamber such that the internal pressure of said chamber is greater than one-half the atmospheric pressure at room temperature after sealing;
   introducing an inert gas into the atmosphere of said sealing chamber, thereby pre-sealing said semiconductor device with said glass frit under the inert gas atmosphere; and
   introducing oxygen gas into the atmosphere of said sealing chamber, thereby completing the sealing of said semiconductor device with said glass frit.

2. The method of claim 1, wherein the atmosphere of said sealing chamber is pressurized to 0.6 to 0.8 atmospheric pressure.

3. The method of claim 1, wherein said inert gas comprises nitrogen gas.

4. The method of claim 3, wherein the atmosphere of said sealing chamber is pressurized to 0.6 to 0.8 atmospheric pressure.

* * * * *